United States Patent
Sasatani et al.

(10) Patent No.: US 6,967,438 B2
(45) Date of Patent: Nov. 22, 2005

(54) DISPLAY DEVICE WITH DESICCANT COATING

(75) Inventors: Toru Sasatani, Gifu (JP); Tetsuji Omura, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 42 days.

(21) Appl. No.: 10/383,886

(22) Filed: Mar. 10, 2003

(65) Prior Publication Data
US 2003/0209980 A1 Nov. 13, 2003

(30) Foreign Application Priority Data
Mar. 8, 2002 (JP) .............................. 2002-063983

(51) Int. Cl.[7] .............................................. H05B 33/04
(52) U.S. Cl. ........................ 313/512; 313/504; 445/24
(58) Field of Search ............................... 313/512, 504, 313/506, 495, 498, 553; 445/24

(56) References Cited

U.S. PATENT DOCUMENTS

| | | | |
|---|---|---|---|
| 6,081,071 A * | 6/2000 | Rogers ....................... | 313/512 |
| 6,836,071 B2 | 12/2004 | Mashiko et al. | |
| 6,888,307 B2 * | 5/2005 | Silvernail et al. ............ | 313/512 |
| 2002/0057565 A1 * | 5/2002 | Seo .............................. | 362/84 |
| 2003/0020401 A1 * | 1/2003 | Park et al. ................... | 313/512 |
| 2003/0038590 A1 * | 2/2003 | Silvernail et al. ............ | 313/504 |
| 2003/0039859 A1 * | 2/2003 | Ohata ........................... | 428/690 |
| 2003/0168976 A1 * | 9/2003 | Nishimura et al. .......... | 313/512 |
| 2004/0020244 A1 * | 2/2004 | Kramer et al. ................ | 65/106 |
| 2004/0051449 A1 * | 3/2004 | Klausmann et al. ......... | 313/512 |

FOREIGN PATENT DOCUMENTS

| | | |
|---|---|---|
| JP | 2000-195663 | 7/2000 |
| KR | 2001-0093711 | 10/2001 |

* cited by examiner

*Primary Examiner*—Mariceli Santiago
*Assistant Examiner*—Sikha Roy
(74) *Attorney, Agent, or Firm*—Morrison & Foerster LLP (57) ABSTRACT

In a display device which is formed by attaching together a device substrate and a sealing substrate, a desiccant is coated to form a shape having a plurality of bending portions on the sealing substrate. Furthermore, the path coated with the desiccant on the sealing substrate is longer than conventional devices, thereby increasing a gross surface area and thus improving moisture absorption effect.

13 Claims, 8 Drawing Sheets

DISPLAY DEVICE WITH DESICCANT COATING

BACKGROUND OF THE INVENTION

1. Field of the Invention

The present invention relates to a display device provided with a self-emission element, especially to a display device provided with an electroluminescent element and a thin film transistor.

2. Description of the Related Art

In recent years, electroluminescent (hereafter, referred to as an EL) display devices with an EL element have been receiving an attention as a display device substituting for a CRT and an LCD. For example, research and developments are being pursued for the EL display device provided with a thin film transistor (hereafter, referred to as a TFT) as a switching element for driving the EL element.

The above-mentioned EL display device is formed, for example, by laminating the TFT and an organic EL element sequentially on a transparent glass substrate (hereafter, referred to as an insulating substrate).

A gate electrode is formed on the insulating substrate, and a gate insulating film and an active layer made of a p-Si film are laminated sequentially thereon.

In the active layer, a channel is provided above the gate electrode, and source and drain regions are severally provided on both sides of the channel above the gate electrode.

An interlayer insulating film is formed on the whole surfaces of the gate insulating film and the active layer, and a drain electrode is formed by filling metal such as Al in a contact hole provided correspondingly to the drain region.

Furthermore, on the whole surface of the interlayer insulating film, there are formed a planarization insulation layer for planarizing the surface, which is made of, for example, organic resin, and a contact hole on a position corresponding to the source region in the planarization insulation layer. On the planarization insulation layer, there is formed an anode of the EL element, which serves as a source electrode made of ITO (Indium Tin Oxide) and contacting to the source region through the contact hole.

A hole transport layer is formed on the anode of ITO and an emissive layer is formed thereon. An electron transport layer is formed to cover the emissive layer and a cathode is laminated thereon.

Figure 7A:
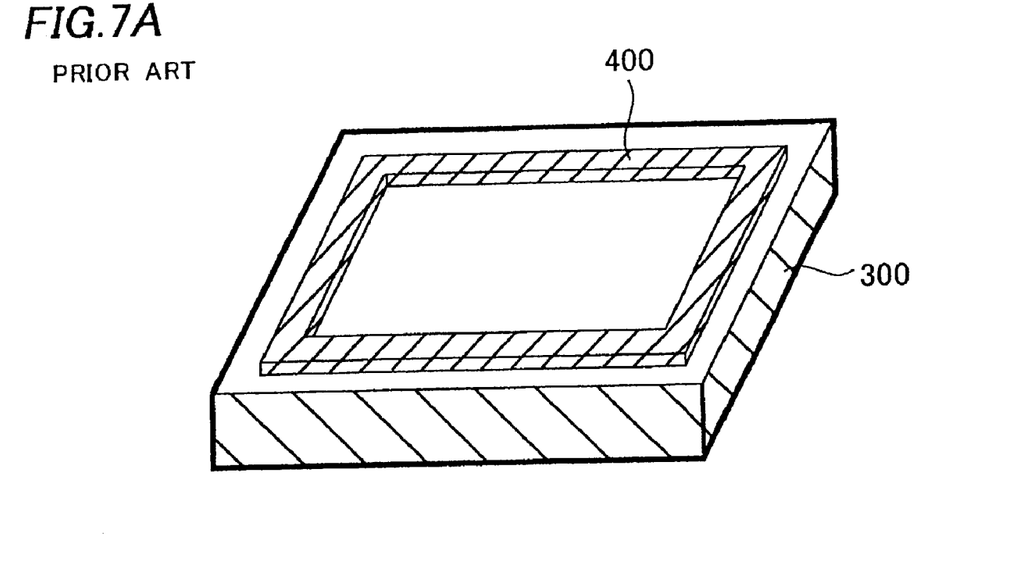
FIGS. 7A and 7B are views for explaining a conventional adhering structure of a device substrate and a sealing substrate.
Figure 7B:
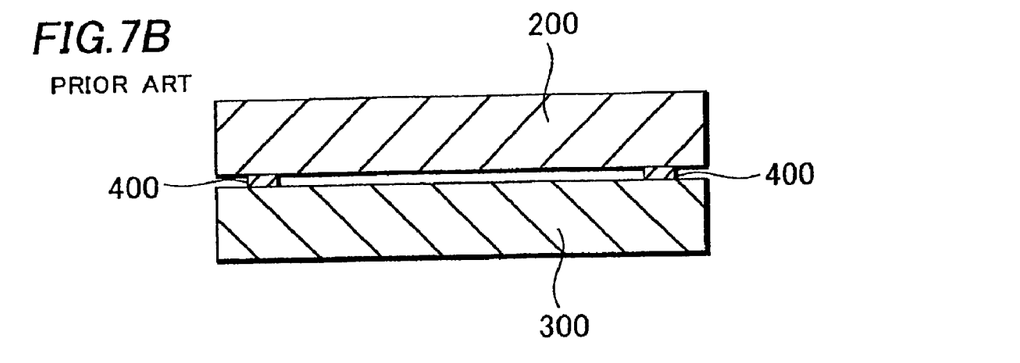

FIGS. 7A and 7B are explanatory views of a sealing structure of a conventional EL display device. As shown in FIGS. 7A and 7B, a device substrate 200, which is integrated with the above EL elements, and a sealing substrate 300 made of a glass substrate are attached together with a sealing resin 400 interposed therebetween which is made of, for example, epoxy resin and coated on the sealing substrate 300 by a dispenser. The device substrate 200 and the sealing substrate 300 are attached together by heating and hardening the sealing resin 400 interposed therebetween.

In this adhesion, a desiccant is coated on the sealing substrate to absorb moisture from outside, thereby reducing the effect of the moisture on the operation of the EL element. In doing so, only the weight of the desiccant is considered in terms of the moisture absorption capacity of the desiccant. The conventional device with such a desiccant, however, is not efficient in the moisture absorption.

SUMMARY OF THE INVENTION

The invention provides a display device including a device substrate having a display element thereon, a sealing substrate attached to the device substrate to seal the display element between the device and sealing substrates, and a coating line of a desiccant formed on the inside surface of the sealing substrate, which faces the device substrate. The coating line includes at least one bending portion bending within a plane of the sealing substrate.

The invention provides a display including a device substrate having a display element thereon, a sealing substrate attached to the device substrate to seal the display element between the device and sealing substrates, and a plurality of islands of a desiccant formed on an inside surface of the sealing substrate, which faces the device substrate.

DETAILED DESCRIPTION OF THE INVENTION

There will be described hereinafter a first embodiment of this invention. This embodiment as well as other embodiments of this invention use an organic EL display device as an example.

Figure 2:
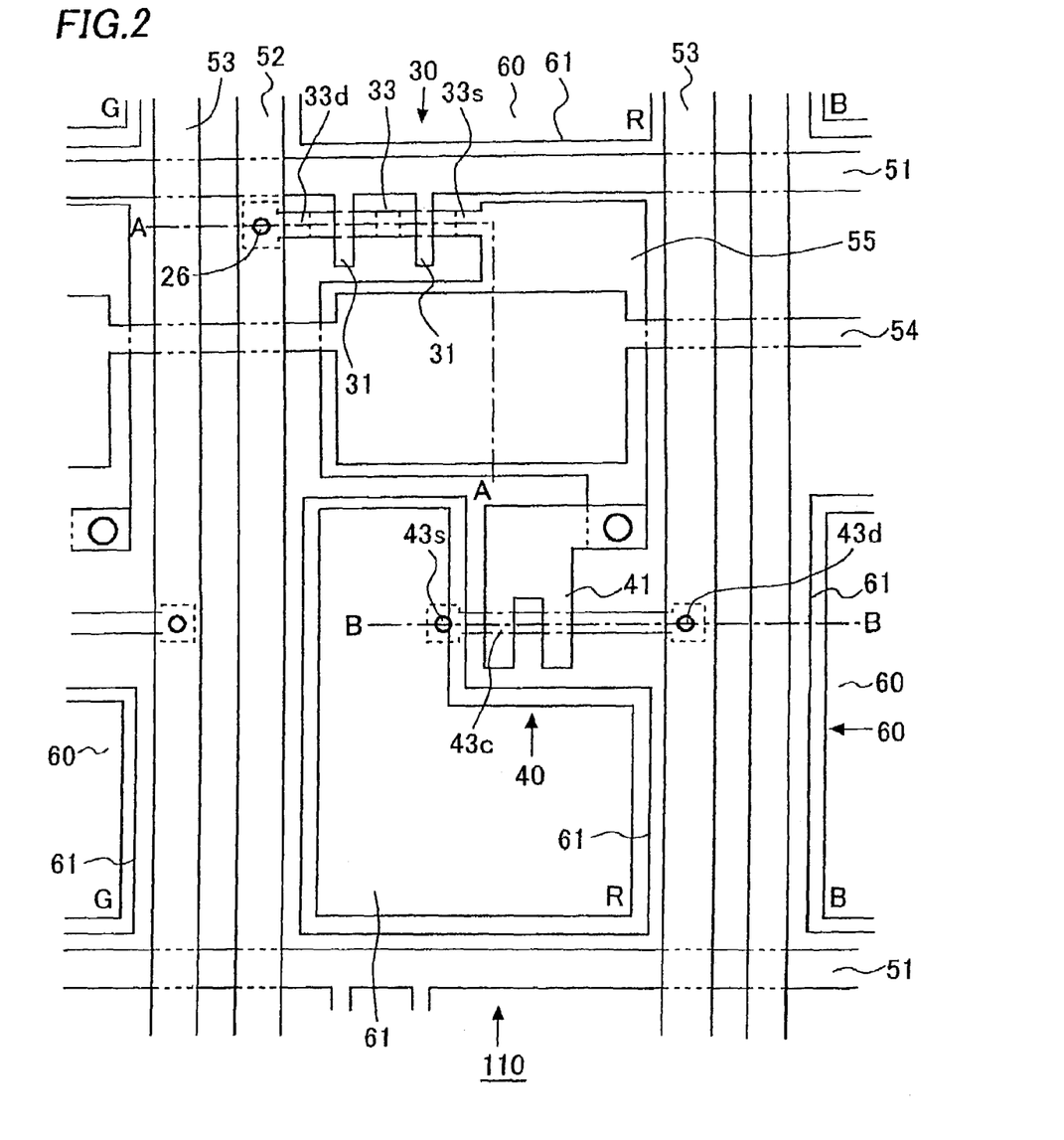
FIG. 2 is a plan view of an EL display device of the first embodiment.
Figure 3A:
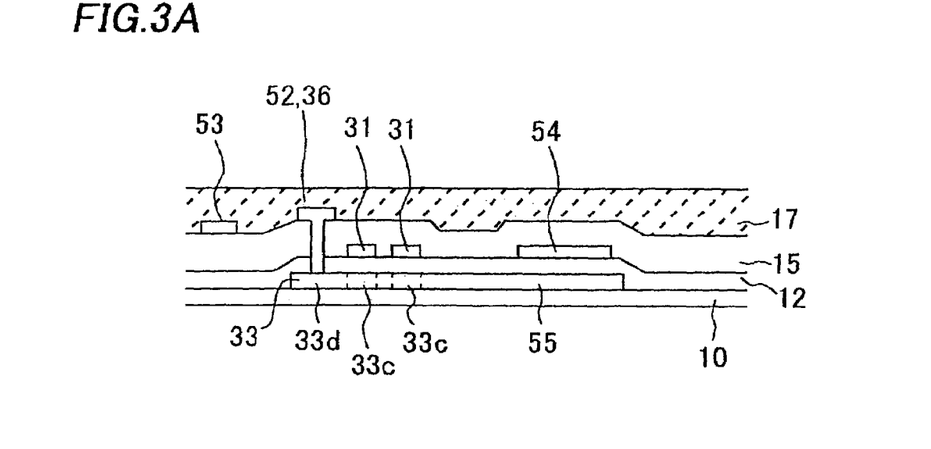
FIGS. 3A and 3B are cross-sectional views of the EL display device of FIG. 2.
Figure 3B:
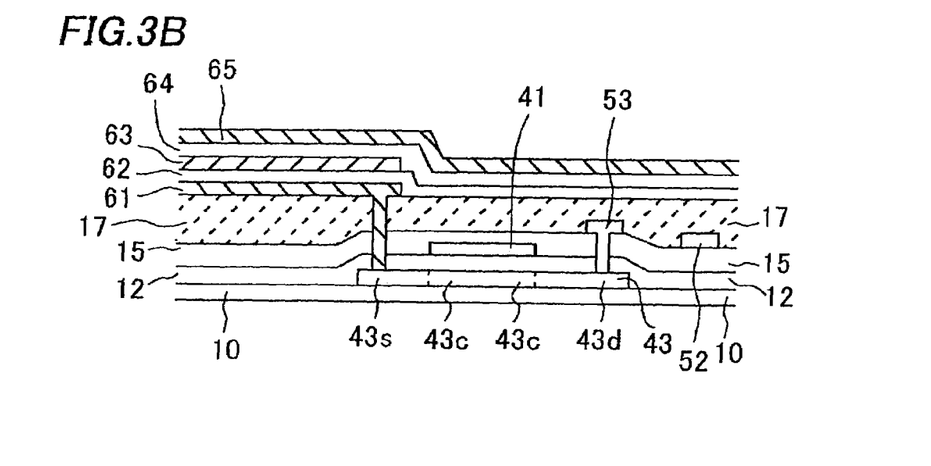

FIG. 2 shows a plan view of a pixel of the organic EL display device of this embodiment. FIG. 3A shows a cross-sectional view along A—A line of FIG. 2 and FIG. 3B shows a cross-sectional view along B—B line of FIG. 2.

As shown in FIG. 2, a pixel 110 is formed in a region enclosed with a gate signal line 51 and a drain signal line 52. The pixels 110 are disposed in a matrix.

There are disposed in the pixel 110 an organic EL element 60 as a self-emission element, a switching TFT 30 for controlling a timing of supplying an electric current to the organic EL element 60, a driving TFT 40 for supplying an electric current to the organic EL element 60 and a storage capacitor. The organic EL element 60 is formed of an anode 61, an emissive layer made of an emission material, and a cathode 65.

The switching TFT 30 is provided in a periphery of a point of intersection of the both signal lines 51 and 52. A source 33s of the switching TFT 30 serves as a capacitor electrode 55 for forming a capacitor with a storage capacitor electrode line 54 and is connected to a gate electrode 41 of the driving TFT 40. A source 43s of the driving TFT 40 is connected to the anode 61 of the organic EL element 60, while a drain 43*d* is connected to a driving source line 53 as a current source to be supplied to the organic EL element 60.

The storage capacitor electrode line 54 is disposed in parallel with the gate signal line 51. The storage capacitor electrode line 54 is made of Cr (chromium) and forms a capacitor by storing an electric charge with the capacitor electrode 55 connected to the source 33*s* of the TFT through a gate insulating film 12. A storage capacitor 56 is provided for storing voltage applied to the gate electrode 41 of the driving TFT 40.

As shown in FIGS. 3A and 3B, the organic EL display device is formed by laminating the TFTs and the organic EL element sequentially on a substrate 10 such as a substrate made of glass or synthetic resin, a conductive substrate, or a semiconductor substrate. When using a conductive substrate or a semiconductor substrate as the substrate 10, however, an insulating film such as $SiO_2$ or SiN is formed on the substrate 10, and then the switching TFT 30, the driving TFT 40 and the organic EL element 60 are formed thereon. Each of the both TFTs has a so-called top gate structure in which a gate electrode is disposed above an active layer with a gate insulating film being interposed therebetween.

There will be described the switching TFT 30 first.

As shown in FIG. 3A, an amorphous silicon film (hereafter, referred to as an a-Si film) is formed on the insulating substrate 10 made of a silica glass or a non-alkali glass, by a CVD method. The a-Si film is irradiated by laser beams for melting and recrystalizing to form a poly-silicon film (hereafter, referred to as a p-Si film) as an active layer 33. On the active layer 33, a single-layer or a multi-layer of an $SiO_2$ film and an SiN film is formed as the gate insulating film 12. There are disposed on the gate insulating film 12 the gate signal line 51 made of metal having a high melting point such as Cr and Mo (molybdenum) and also serving as a gate electrode 31, the drain signal line 52 made of Al (aluminum), and the driving source line 53 made of Al and serving as a driving source of the organic EL element.

An interlayer insulating film 15 laminated with an $SiO_2$ film, an SiN film and an $SiO_2$ film sequentially is formed on the whole surfaces of the gate insulating film 12 and the active layer 33. There is provided a drain electrode 36 by filling metal such as Al in a contact hole provided correspondingly to a drain 33*d*. Furthermore, a planarization insulation film 17 for planarizing a surface which is made of organic resin is formed on the whole surface.

Next, there will be described the driving TFT 40 of the organic EL element. As shown in FIG. 3B, an active layer 43 formed by poly-crystalizing an a-Si film by irradiating laser beams thereto, the gate insulating film 12, and the gate electrode 41 made of metal having a high melting point such as Cr and Mo are formed sequentially on the insulating substrate 10 made of a silica glass or anon-alkali glass. There are provided in the active layer 43 a channel 43*c*, and a source 43*s* and a drain 43*d* on both sides of the channel 43*c*. The interlayer insulating film 15 laminated with an $SiO_2$ film, an SiN film and an $SiO_2$ film sequentially is formed on the whole surfaces of the gate insulating film 12 and the active layer 43. There is provided the driving source line 53 connected to a driving source by filling metal such as Al in a contact hole provided correspondingly to a drain 43*d*. Furthermore, a planarization insulation film 17 for planarizing the surface, which is made of, for example, organic resin is formed on the whole surface. A contact hole is formed in a position corresponding to a source 43*s* in the planarization insulation film 17. There is formed on the planarization insulation film 17 a transparent electrode made of ITO and contacting to the source 43*s* through the contact hole, i.e., the anode 61 of the organic EL element. The anode 61 is formed in each of the pixels, being isolated as an island.

The organic EL element 60 has a structure of laminating sequentially the anode 61 made of a transparent electrode such as ITO, a first hole transport layer made of MTDATA (4,4-bis (3-methylphenylphenylamino) biphenyl), a hole transport layer 62 made of a second hole transport layer made of TPD (4,4,4-tris (3-methylphenylphenylamino) triphenylanine), an emissive layer 63 made of $Bebq_2$ (bis (10-hydroxybenzo[h]quinolinato)beryllium) containing a quinacridone derivative, an electron transport layer 64 made of $Bebq_2$, and a cathode 65 made of magnesium-indium alloy, aluminum or aluminum alloy.

In the organic El element 60, a hole injected from the anode 61 and an electron injected from the cathode 65 are recombined in the emissive layer and an exciton is formed by exciting an organic module forming the emissive layer 63. Light is emitted from the emissive layer 63 in a process of relaxation of the exciton and then released outside after going through the transparent anode 61 to the transparent insulating substrate 10.

The descriptions below uses the same reference numerals as in FIGS. 7A and 7B for the corresponding components of this embodiment The EL element 60 integrated in a device substrate 200 is resin-sealed with a sealing substrate 300 using a sealing resin 400 (see FIGS. 7A and 7B) interposed between the substrates.

Figure 1A:
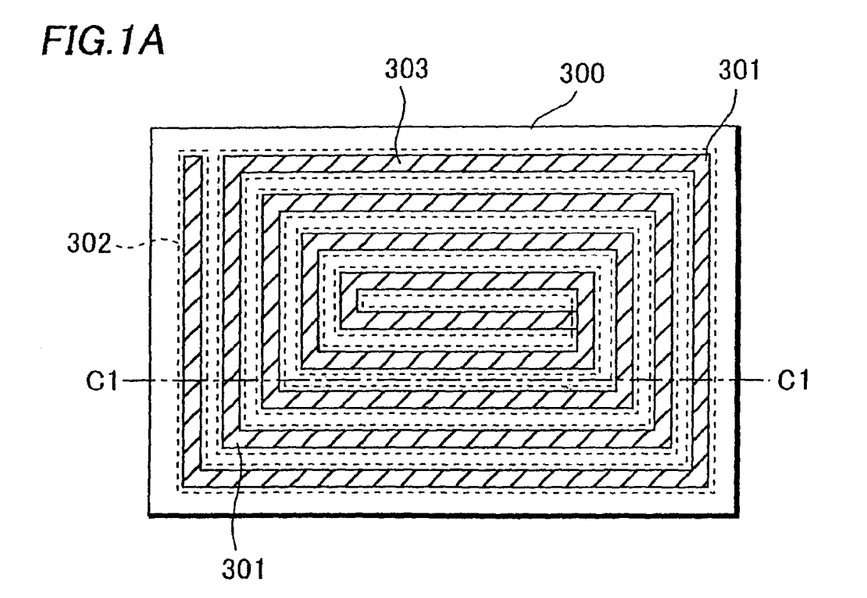
FIGS. 1A and 1B are plan views of two different desiccant coating configurations on a sealing substrate of a first embodiment of this invention.
Figure 1B:
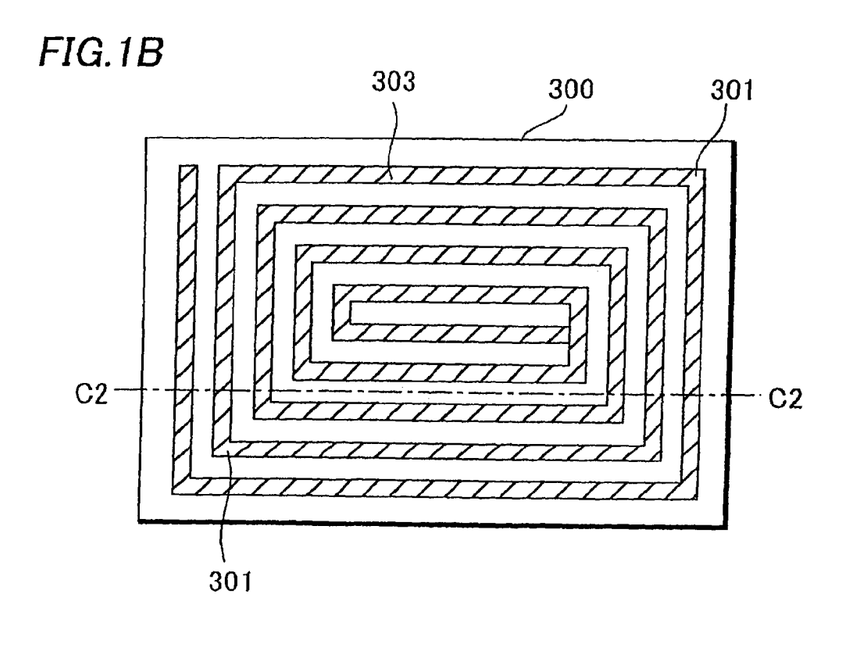

In this embodiment, a desiccant 303 is coated to form a shape having a plurality of the bending portions 301 on the sealing substrate 300 as shown in FIGS. 1A and 1B. The device substrate 200 and the sealing substrate 300 are attached together so that the desiccant 303 is coated to form a spiral shape having the plurality of the bending portions 301. The desiccant 303 is coated in a groove 302 provided on the sealing substrate 300 in the configuration of FIG. 1A and the desiccant 303 is coated directly on the sealing substrate 300 in the configuration of FIG. 1B.

Figure 4A:
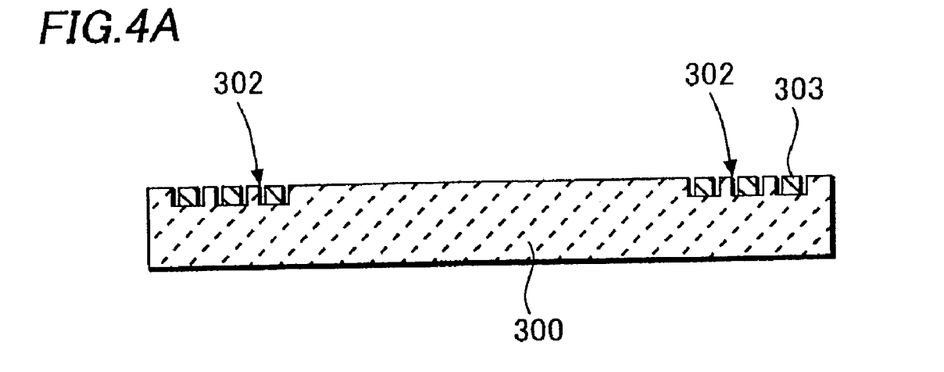
FIGS. 4A and 4B are cross-sectional views of the desiccant coating configurations of FIGS. 1A and 1B, respectively.
Figure 4B:
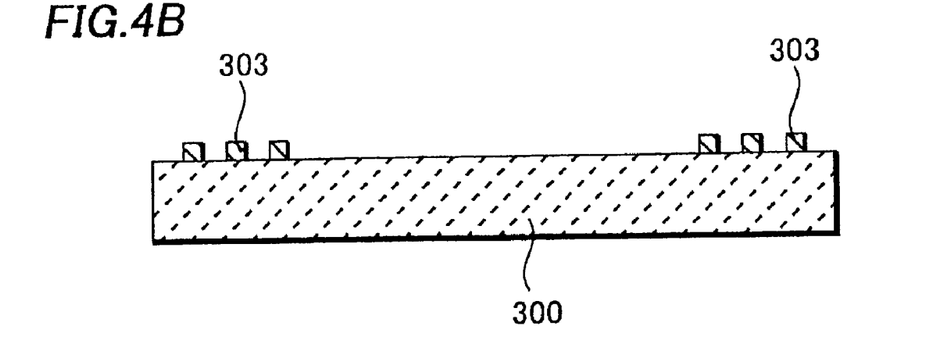

FIG. 4A shows a cross-sectional view along C1—C1 line of FIG. 1A, and FIG. 4B shows a cross-sectional view along C2—C2 line of FIG. 1B. When coating the desiccant 303 in the groove 302, the desiccant 303 is coated not to completely fill the groove 302, and there is a clearance between the side wall of the groove 302 and the desiccant 303. Thus, as well as the desiccant 303 directly coated on the sealing substrate 300 as shown in FIG. 4B, the desiccant 303 coated in the groove 302 can have a gross surface area larger than that of the desiccant used in conventional sealing structures.

In this configuration, even if the amount of the desiccant 303 coated in the groove 302 formed on the sealing substrate 300 or the amount of the desiccant 303 directly coated on the sealing substrate 300 is the same as an amount of the desiccant of the conventional sealing structure, the gross surface area of the desiccant 303 is increased since a path coated with the desiccant 303 is prolonged being bent multiple times within the plane of the sealing substrate. In addition, the side wall of the coating line, or the path, is not covered, contributing to the increase of the gross surface area. Therefore, the absorption of moisture is improved, thereby producing a moisture-proof EL element 60 integrated in the device substrate 200.

The bending portions 301 are not limited to those of right angle on a corner as shown in FIGS. 1A and 1B, and can be those of a predetermined radial shape on the corner (not shown).

Furthermore, in this embodiment, for example, powdered potassium oxide, and powdered barium oxide and, are used as the desiccant 303. Those dissolved in the resin with solvent are coated in the groove 301 or on the sealing substrate 300, and hardened by heating.

There will be described other embodiments of the invention with reference to FIGS. 5A–6B.

Figure 5A:
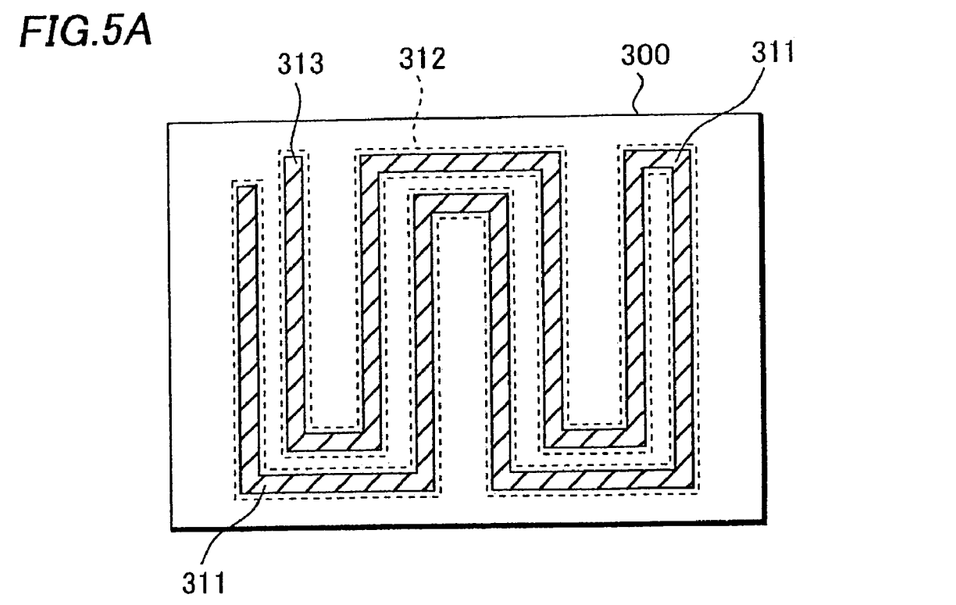
FIGS. 5A and 5B are plan views of two different desiccant coating configurations on a sealing substrate of a second embodiment of this invention.
Figure 5B:
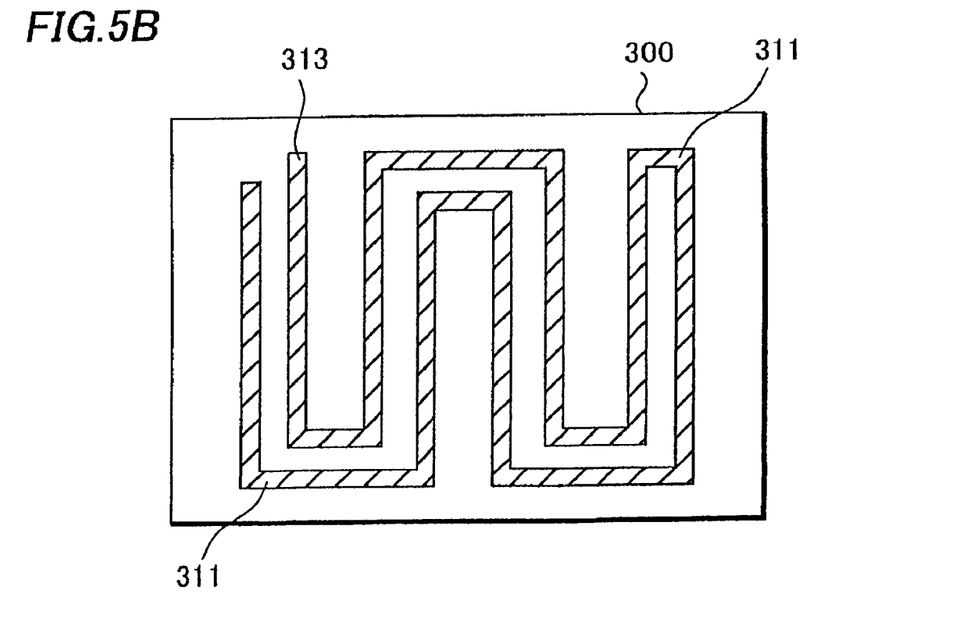

FIGS. 5A and 5B show a second embodiment and a state that a desiccant 313 is coated to form a zigzag shape having a plurality of bending portions 311 on the sealing substrate 300.

In FIG. 5A, the desiccant 313 is coated in a groove 312 provided on the sealing substrate 300. In FIG. 5B, the desiccant 313 is coated directly on the sealing substrate 300. In this case, too, the desiccant 313 is coated not to completely fill the groove 312.

In this embodiment, the desiccant 313 is coated to form a shape having the bending portions 311, thereby to prolong a path coated with the desiccant 313. Thus, even if the amount of the desiccant 313 is the same as the amount of the desiccant of conventional structure, the efficiency of moisture-proof is improved since there is an increased a gross surface area of the desiccant 313, which is formed of a top surface and a side wall surface. Accordingly, poor operation of the EL element 60 can be inhibited.

The bending portions 311 are not limited to those of right angle on a corner as shown in FIG. 5A and FIG. 5B, and can be those of a predetermined radial shape on the corner.

Figure 6A:
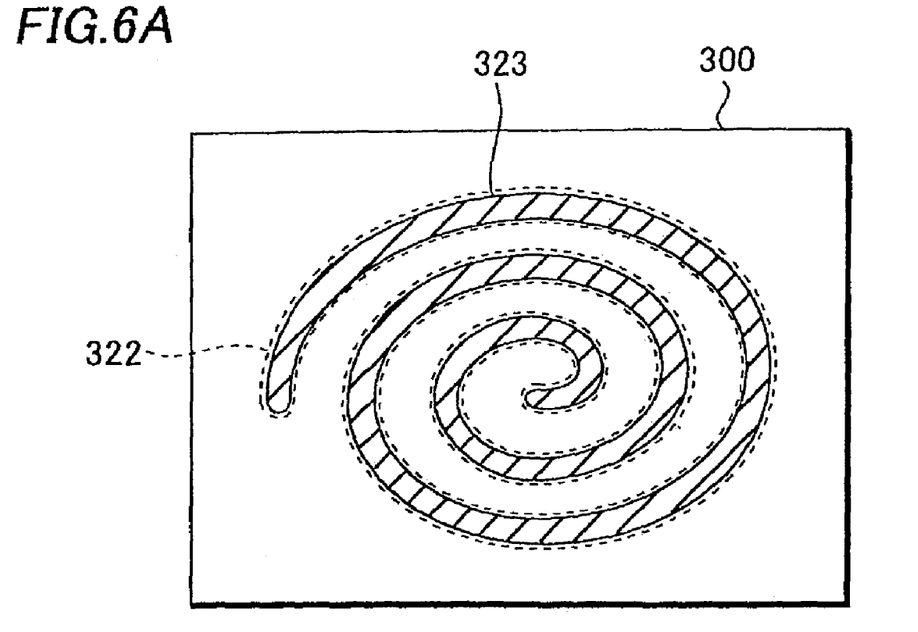
FIGS. 6A and 6B are plan views of two different desiccant coating configurations on a sealing substrate of a third embodiment of this invention.
Figure 6B:
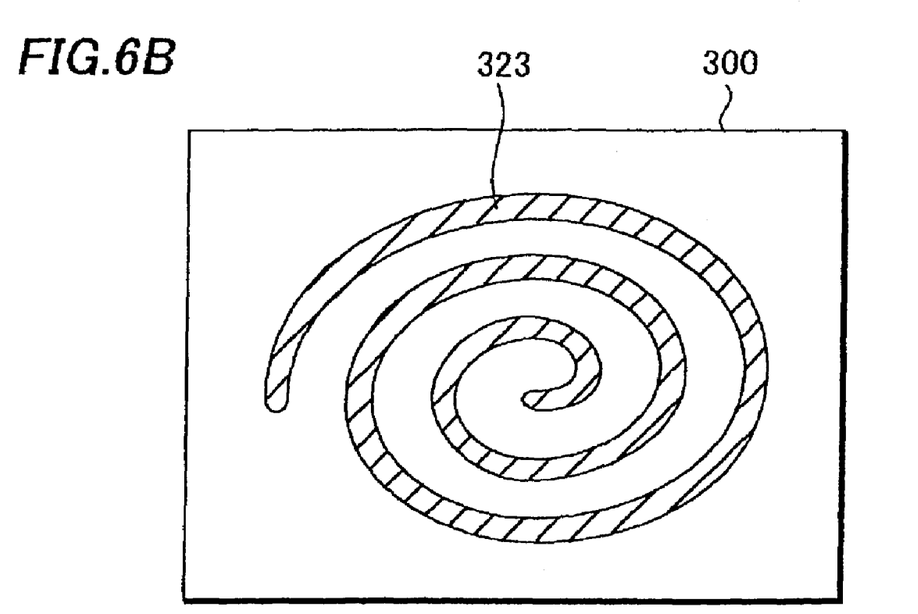

Next, FIGS. 6A and 6B show a third embodiment in which a desiccant 323 is coated to form a swirl shape on the sealing substrate 300.

In FIG. 6A, the desiccant 323 is coated in a groove 322 provided on the sealing substrate 300. In this case, too, the desiccant 323 is coated not to completely fill the groove 322. In FIG. 6B, the desiccant 323 is coated directly on the sealing substrate 300.

In this embodiment, when coating the desiccant 323, the desiccant 323 is coated to form the swirl shape, thereby to prolong a path coated with the desiccant 323. Thus, even when the amount of the desiccant 323 is the same as the amount of the desiccant of the conventional structure, the efficiency of moisture-proof is improved since there is increased a gross surface area of the desiccant 323, which is formed of a top surface and a side wall surface. Accordingly, poor operation of the EL element 60 is avoided.

Figure 6C:
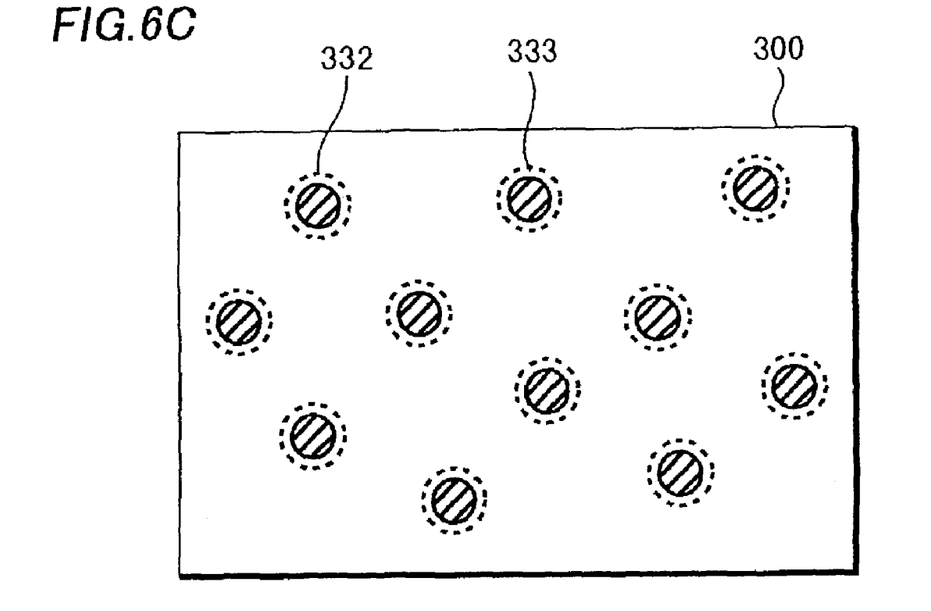
FIGS. 6C and 6D are plan views of two different desiccant coating configurations on a sealing substrate of a fourth embodiment of this invention.
Figure 6D:
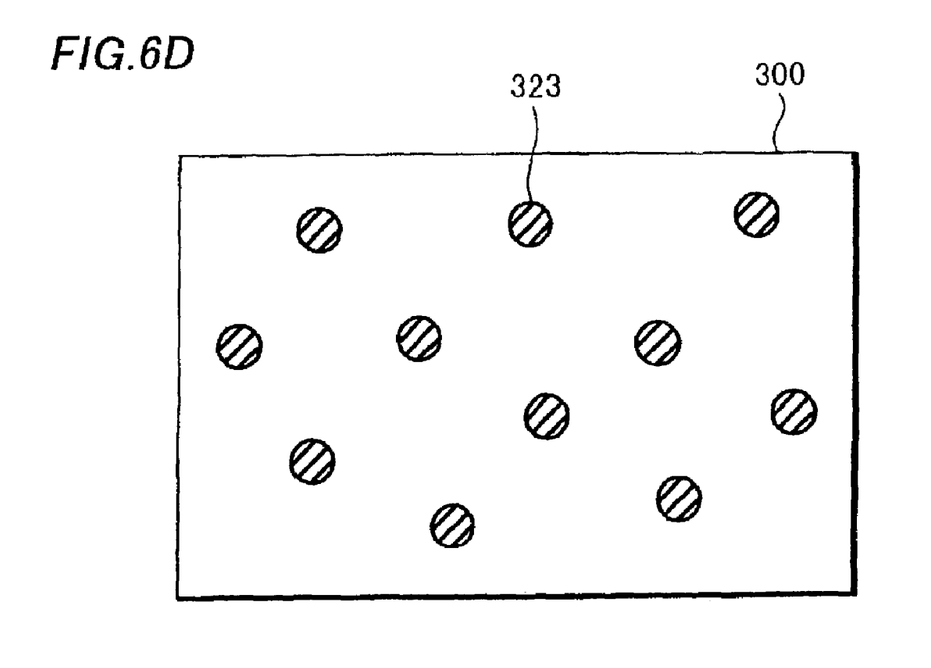

FIGS. 6C and 6D show a fourth embodiment in which a desiccant 333 is coated to form separated islands on the sealing substrate 300. In FIG. 6C, the desiccant 333 is coated in a groove 332 provided on the sealing substrate 300. In this case, too, the desiccant 333 is coated not to completely fill the groove 332. In FIG. 6D, the desiccant 333 is coated directly on the sealing substrate 300. By adjusting the numbers of the islands and their shape, it is possible to improve the efficiency of moisture-proof over the conventional sealing structure. Although the shape of the islands shown in FIGS. 6C and 6D is circular, other shapes may be applicable to this embodiment.

In the above embodiments, there are disclosed configurations in which the grooves 302, 312, 322 are provided on the sealing substrate 300 and the desiccants 303, 313, 323 are coated in the grooves 302, 312, 322, and configurations in which the desiccants 303, 313, 323 are coated directly on the sealing substrate 300. In the first type of the configurations, there is formed no step structure due to the film thickness of the desiccant, which may hinder the adhesion of the sealing substrate 300 and the device substrate 200. Furthermore, even when the second type of the configurations is applied, the projection of the desiccant coating line from the top surface of the sealing substrate 300 may be prevented by forming a large recess, which covers the most of the surface of the sealing substrate 300 except its peripheral portions, and placing the entire desiccant coating line in that recess.

Furthermore, this invention is directed to increasing the gross surface area of the desiccant by devising coating shapes of the desiccant, and the configurations of the above-described embodiments can be changed to a variety of configurations.

Furthermore, although an EL display device is used as an example in the embodiments above, this invention is applicable to a variety of display devices such as a liquid crystal display.

What is claimed is:

1. A display device comprising:
a device substrate having a display element thereon;
a sealing substrate attached to the device substrate to seal the display element between the device and sealing substrates; and
a coating line of a desiccant formed on an inside surface of the sealing substrate, the inside surface of the sealing substrate facing the device substrate,
wherein the coating line comprises at least one bending portion bending within a plane of the sealing substrate, and has a first end located at a peripheral portion of the inside surface of the sealing substrate and a second end located closer to a center of the inside surface of the sealing substrate than the first end.

2. The display device of claim 1, wherein a side wall of the coating line is located above a top of the inside surface of the sealing substrate.

3. The display device of claim 1, wherein the display element of the device substrate comprises an electroluminescent element.

4. The display device of claim 1, wherein the inside surface of the sealing substrate comprises a groove and the coating line of the desiccant is disposed in the groove.

5. The display device of claim 4, wherein the coating line is disposed in the groove so that the coating line does not touch a side wall of the groove.

6. A display device comprising:
a device substrate having a display element thereon;
a sealing substrate attached to the device substrate to seal the display element between the device and sealing substrates; and
a coating line of a desiccant formed on an inside surface of the sealing substrate, the inside surface of the sealing substrate facing the device substrate,
wherein the coating line forms a spiral within a plane of the sealing substrate that has bending portions at corners of the sealing substrate.

7. A display device comprising:
a device substrate having a display element thereon;
a sealing substrate attached to the device substrate to seal the display element between the device and sealing substrates; and
a coating line of a desiccant formed on an inside surface of the sealing substrate, the inside surface of the sealing substrate facing the device substrate,
wherein the coating line forms a zigzag within a plane of the sealing substrate.

8. A display device comprising:
a device substrate having a display element thereon;
a sealing substrate attached to the device substrate to seal the display element between the device and sealing substrates; and a coating line of a desiccant formed on an inside surface of the sealing substrate, the inside surface of the sealing substrate facing the device substrate, wherein the coating line forms a swirl within a plane of the sealing substrate.

9. A display device comprising:

a device substrate having a display element thereon;

a sealing substrate attached to the device substrate to seal the display element between the device and sealing substrates; and a plurality of islands of a desiccant attached to an inside surface of the sealing substrate, the inside surface of the sealing substrate facing the device substrate and some of the islands being disposed above the display element.

10. The display device of claim 9, wherein side walls of the islands of the desiccant are located above a top of the inside surface of the sealing substrate.

11. The display device of claim 9, wherein the display element of the device substrate comprises an electroluminescent element.

12. A display device comprising:

a device substrate having a display element thereon;

a sealing substrate attached to the device substrate to seal the display element between the device and sealing substrates; and a plurality of islands of a desiccant formed on an inside surface of the sealing substrate, the inside surface of the sealing substrate facing the device substrate, wherein the inside surface of the sealing substrate comprises a plurality of dents and the islands of the desiccant are disposed in corresponding dents.

13. The display device of claim 12, wherein the islands are disposed in the dents so that the islands do not touch side walls of the corresponding dents.

\* \* \* \* \*